(12) United States Patent
Albou et al.

(10) Patent No.: US 10,100,997 B2
(45) Date of Patent: Oct. 16, 2018

(54) SEMICONDUCTOR LIGHT SOURCE AND DRIVING AID SYSTEM FOR A MOTOR VEHICLE COMPRISING SUCH A SOURCE

(71) Applicant: Valeo Vision, Bobigny (FR)

(72) Inventors: Pierre Albou, Bobigny (FR); Benoit Reiss, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/446,242

(22) Filed: Mar. 1, 2017

(65) Prior Publication Data

US 2017/0254498 A1 Sep. 7, 2017

(30) Foreign Application Priority Data

Mar. 2, 2016 (FR) ...................... 16 51752

(51) Int. Cl.
| | |
|---|---|
| B60Q 1/34 | (2006.01) |
| B60Q 1/26 | (2006.01) |
| B60Q 1/44 | (2006.01) |
| B60Q 1/22 | (2006.01) |
| F21S 8/10 | (2006.01) |
| F21S 43/13 | (2018.01) |
| H01L 31/12 | (2006.01) |
| H01L 33/08 | (2010.01) |
| H01L 33/24 | (2010.01) |

(Continued)

(52) U.S. Cl.
CPC ............... *F21S 43/13* (2018.01); *B60Q 1/22* (2013.01); *B60Q 1/2607* (2013.01); *B60Q 1/34* (2013.01); *B60Q 1/44* (2013.01); *F21S 48/214* (2013.01); *H01L 31/125* (2013.01); *H01L 33/08* (2013.01); *H01L 33/24* (2013.01); *B60Q 1/085* (2013.01); *B60Q 2400/10* (2013.01); *F21S 8/10* (2013.01); *F21S 41/141* (2018.01); *F21S 43/00* (2018.01); *F21S 48/115* (2013.01); *F21Y 2107/30* (2016.08); *F21Y 2113/13* (2016.08); *F21Y 2115/20* (2016.08)

(58) Field of Classification Search
None
See application file for complete search history.

(56) References Cited

U.S. PATENT DOCUMENTS 8,669,574 B2 * 3/2014 Konsek .................. B82Y 20/00
257/98
8,835,903 B2 9/2014 Gwo et al.
(Continued)

FOREIGN PATENT DOCUMENTS

| DE | 102013104273 A1 | 10/2014 |
|---|---|---|
| EP | 2819326 A1 | 12/2014 |
| WO | 2010014032 A1 | 2/2010 |

*Primary Examiner* — Ashok Patel
(74) *Attorney, Agent, or Firm* — Oblon, McClelland, Maier & Neustadt, L.L.P.

(57) ABSTRACT

A semiconductor light source and driving aid system for a motor vehicle comprising a semiconductor light source. The semiconductor light source includes a plurality of electroluminescent rods of submillimetric dimensions. At least certain rods are electrically interconnected in a first assembly dedicated to an emission of a light beam at a first wavelength, and other rods are electrically interconnected in a second assembly dedicated to an emission of a light beam at a second wavelength different from the first wavelength, the first and the second assemblies forming two selectively activable emission areas.

17 Claims, 2 Drawing Sheets

(51) Int. Cl.
  *F21S 43/00*    (2018.01)
  *F21S 41/141*   (2018.01)
  *F21Y 115/20*   (2016.01)
  *F21Y 107/30*   (2016.01)
  *F21Y 113/13*   (2016.01)
  *B60Q 1/08*     (2006.01)

(56) References Cited

U.S. PATENT DOCUMENTS

| | | |
|---|---|---|
| 9,287,445 B2 | 3/2016 | Yoo et al. |
| 9,525,100 B2 | 12/2016 | Yoo et al. |
| 9,531,161 B2 | 12/2016 | Ristic et al. |
| 9,595,649 B2 | 3/2017 | Konsek et al. |
| 2006/0175601 A1* | 8/2006 | Lieber .......... B82Y 10/00 257/19 |
| 2011/0254034 A1* | 10/2011 | Konsek .......... B82Y 20/00 257/98 |
| 2012/0056237 A1* | 3/2012 | Choi .......... H01L 21/02422 257/103 |
| 2012/0223289 A1 | 9/2012 | Gwo et al. |
| 2013/0190971 A1 | 7/2013 | Anderson |
| 2014/0166974 A1 | 6/2014 | Yoo et al. |
| 2014/0239327 A1 | 8/2014 | Konsek et al. |
| 2016/0087150 A1 | 3/2016 | Ristic et al. |
| 2016/0163922 A1 | 6/2016 | Yoo et al. |

\* cited by examiner

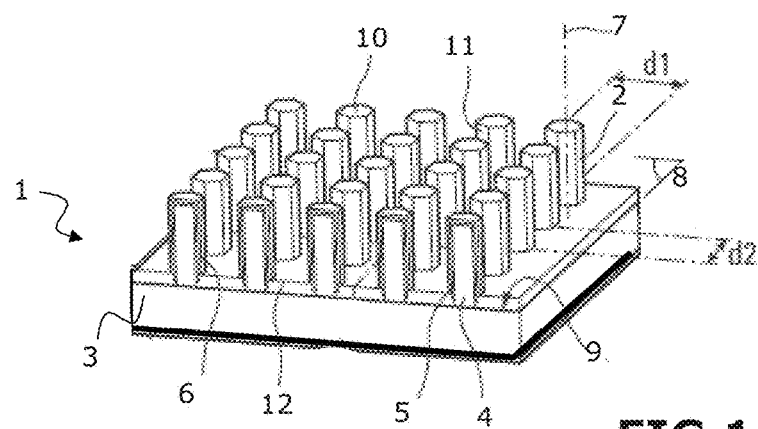
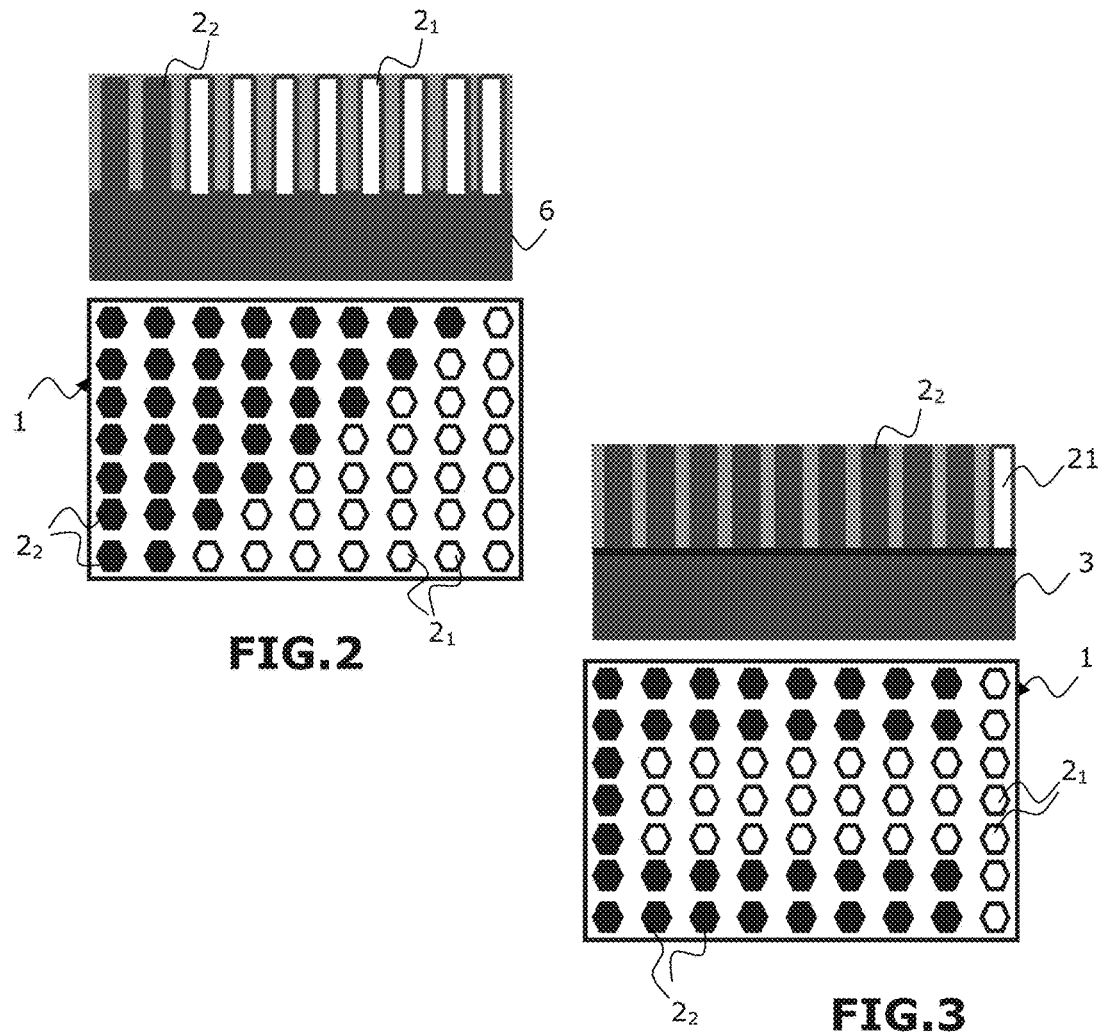

SEMICONDUCTOR LIGHT SOURCE AND DRIVING AID SYSTEM FOR A MOTOR VEHICLE COMPRISING SUCH A SOURCE

CROSS-REFERENCE TO RELATED APPLICATIONS

This application claims priority to the French application 1651752, filed on Mar. 2, 2016, which application is incorporated herein by reference and made a part hereof.

BACKGROUND OF THE INVENTION

1. Field of the Invention

The present invention generally relates to driving aid systems using light sources.

2. Description of the Related Art

Some assistance systems use an onboard camera at the rear of the vehicle to aid the driver in their backup maneuvers. Cameras are also appearing for replacing or supplementing rear-view mirrors. They will soon be an aid for detecting the environment as part of autonomous vehicles.

In use at night, it is necessary to light up the observation area of the camera. During a backup maneuver, generally switching on the backup light is used to light the area on the road near the vehicle. The lighting is nevertheless of limited range and it is not possible to increase the range of a backup light without risking non-compliance with signaling constraints.

SUMMARY OF THE INVENTION

The subject matter of one aspect of the invention is a semiconductor light source including a plurality of electroluminescent rods of submillimetric dimensions, wherein at least certain rods are electrically interconnected in a first assembly dedicated to an emission of a light beam at a first wavelength, and other rods are electrically interconnected in a second assembly dedicated to an emission of a light beam at a second wavelength different from the first wavelength, the first and the second assemblies forming two selectively activable emission areas.

According to other advantageous features:
the first wavelength is selected in the infrared and the second wavelength is selected in the visible spectrum;
as a variant, the first wavelength and the second wavelength are selected in the visible spectrum;
the light source may further comprise a third assembly of electrically interconnected electroluminescent rods, the third assembly being dedicated to receiving a light beam at a third wavelength;
the third wavelength is selected so that the third assembly forms a reception area capable of receiving light beams at the first wavelength;
the electroluminescent rods are preferably on the same substrate;
the rods of the first assembly and the rods of the second assembly are distributed preferably so that the first assembly and the second assembly form two areas nested together;
the rods are, for example, separated two by two by a distance of less than or equal to 30 microns.

The subject matter of the present invention is also a driving aid system for a motor vehicle, wherein it comprises at least one semiconductor light source including a plurality of electroluminescent rods of submillimetric dimensions, in which at least certain rods are electrically interconnected in a first assembly dedicated to an emission of a light beam at a first wavelength, and other rods are electrically interconnected in a second assembly dedicated to an emission of a light beam at a second wavelength different from the first wavelength, the first and the second assemblies forming two selectively activable emission areas, and a receiving device capable of receiving light beams at the first wavelength.

The receiving device is formed, for example, by a camera.

The at least one light source may also comprise a third assembly of interconnected electroluminescent rods, the third assembly forming the receiving device.

The at least one light source is placed advantageously in a lighting and/or signaling device of a motor vehicle, and the system further comprises a control device capable of independently activating the two emission areas, simultaneously and/or alternately.

The second wavelength is selected for emitting an amber-colored light, or a red-colored light, or a white-colored light.

The first wavelength is selected preferably in the infrared or in the ultraviolet.

The at least one source may comprise a luminophore on at least an area facing the rods of the first assembly and/or of the second assembly.

These and other objects and advantages of the invention will be apparent from the following description, the accompanying drawings and the appended claims.

BRIEF DESCRIPTION OF THE ACCOMPANYING DRAWINGS

The invention and its advantages will be better understood in the light of the description that follows, made with reference to the accompanying figures, in which:

FIG. 1 schematically illustrates the principle of a semiconductor light source and rods of submillimetric dimensions, with a perspective view in which a row of electroluminescent rods is revealed in section;

FIG. 2 represents, in a schematic view from the side and from above, a first example of a semiconductor light source and rods of submillimetric dimensions in conformity with the present invention;

FIG. 3 represents, in a schematic view from the side and from above, another example of a semiconductor light source and rods of submillimetric dimensions in conformity with the present invention;

DETAILED DESCRIPTION OF THE PREFERRED EMBODIMENTS

Figure 4:
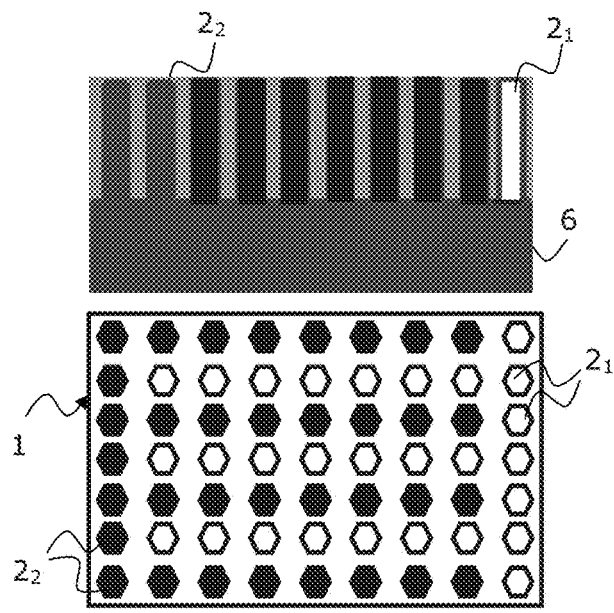
FIG. 4 represents, in a schematic view from the side and from above, another example of a semiconductor light source and rods of submillimetric dimensions in conformity with the present invention.

A source in conformity with the invention is a semiconductor light source including a plurality of electroluminescent rods of submillimetric dimensions, in which at least certain rods are electrically interconnected in a first assembly dedicated to an emission of a light beam at a first wavelength, and other rods are electrically interconnected in a second assembly dedicated to an emission of a light beam at a second wavelength different from the first wavelength, the first and the second assemblies forming two selectively activable emission areas. Examples of assembly configurations will be described from FIG. 2.

In the context of the invention, an assembly of rods emitting at a certain emission wavelength is not meant to be an assembly of rods strictly emitting at a single wavelength like a laser diode but within a certain interval of wavelength which is of the order of 10 nm.

First a description will be given of the structure of a semiconductor light source 1 comprising electroluminescent rods of submillimetric dimensions referring notably to FIG. 2, which figure does not depict the aforementioned assemblies.

With reference to FIG. 1, a light source on which the invention is based is a semiconductor light source 1, including a plurality of electroluminescent rods 2 of submillimetric dimensions, that will henceforth be referred to as electroluminescent rods, i.e. three-dimensional semiconductor sources as will be disclosed below, unlike conventional two-dimensional sources, having substantially plane emissive layers, while a source with electroluminescent rods has emissive layers in the form of raised projections.

These electroluminescent rods 2 preferably originate on the same substrate 3. Each electroluminescent rod 2, here formed by using gallium nitride (GaN), extends perpendicularly, or substantially perpendicularly, projecting from the substrate 3, here silicon-based, other materials such as silicon carbide possibly being used for the substrate 3 without departing from the scope of the invention.

The electroluminescent rods 2 are, for example, made from an aluminum nitride and gallium based compound (AlGaN) notably for emitting ultraviolet. They may also be made, for example, of gallium arsenide (GaAs) for infrared or of an aluminum, indium and gallium phosphide (AlInGaP) for red.

The electroluminescent rods 2 of submillimetric dimensions stretch out from the substrate 3 and each comprises a core 4 made of gallium nitride, around which quantum wells 5 are arranged formed by a radial superposition of layers of different materials, for example, gallium nitride and indium gallium nitride, and a shell 6 surrounding the quantum wells also made of gallium nitride.

Each electroluminescent rod 2 extends along a longitudinal axis 7 defining its height, the base of each electroluminescent rod 2 being arranged in a plane 8 of the upper face 9 of the substrate 3.

The electroluminescent rods 2 of the semiconductor light source 1 may have the same shape. These electroluminescent rods 2 are each delimited by a terminal face 10 and by a circumferential wall 11 which extends along the longitudinal axis 7. When the electroluminescent rods 2 are doped and polarized, the resulting light at the output of the semiconductor light source 1 is mainly emitted from the circumferential wall 11, it being understood that it may be provided that light rays also emerge, at least in small quantity, from the terminal face 10. The result is that each electroluminescent rod 2 acts as a single electroluminescent diode and that the density of the electroluminescent rods 2 improves the performance of this semiconductor light source 1.

Different layers of materials are superposed on the upper face 9 of the substrate 3, notably after the growth of the electroluminescent rods 2 from the substrate 3 here obtained by a bottom-up approach. At least one layer of electrically conductive material may be found among these different layers for the electrical power supply of the electroluminescent rods 2. This layer is etched so as to interconnect particular electroluminescent rods 2, then making it possible for these electroluminescent rods 2 to be controlled simultaneously by a control module not represented here.

The circumferential wall 11 of the electroluminescent rod 2, corresponding to the gallium nitride shell, is covered with a layer of transparent conductive oxide (TCO) 12, which forms the anode of each electroluminescent rod 2 complementary to the cathode formed by the substrate 3. This circumferential wall 11 extends along the longitudinal axis 7 from the substrate 3 up to the terminal face 10, the distance of the terminal face 10 to the upper face 9 of the substrate 3, from which the electroluminescent rods 2 originate, defining the height of each electroluminescent rod 2. By way of example, it is provided that the height of an electroluminescent rod 2 is between 1 and 10 micrometers, while it is provided that the greatest transverse dimension of the terminal face 10, perpendicular to the longitudinal axis 7 of the electroluminescent rod 2 concerned, is less than 2 micrometers. Defining the surface area of the electroluminescent rod 2 may also be provided, in a sectional plane perpendicular to this longitudinal axis 7, in a range of determined values, and notably between 1 and 5 square micrometers.

These dimensions, given by way of a non-restrictive example, make it possible to differentiate a semiconductor light source 2 including electroluminescent rods 2 from a light source of substantially plane diode sources.

It is clear that during the formation of the electroluminescent rods 2, the height may be modified from one light source to another, so as to increase the luminance of the semiconductor light source 1 when the height is increased. The height of the electroluminescent rods 2 may also be modified within a single light source, so that one group of electroluminescent rods 2 may have a height, or heights, different from another group of electroluminescent rods 2.

The shape of the electroluminescent rods 2 may also vary from one device to another, notably regarding the section of the electroluminescent rods 2 and the shape of the terminal face 10. FIG. 1 illustrates the electroluminescent rods 2 having a general cylindrical shape, and notably polygonal in section, here more particularly hexagonal. Clearly it is important that light may be emitted through the circumferential wall 11, and that this has a polygonal or circular shape, for example.

Moreover, the terminal face 10 may have a substantially flat shape perpendicular to the circumferential wall 11, so that it extends substantially parallel to the upper face 9 of the substrate 3, as illustrated in FIG. 1, or else it may have a rounded or pointed shape at its center, in order to multiply the directions of emission of the light emerging from this terminal face 10.

In FIG. 1, the electroluminescent rods 2 are arranged in a two-dimensional matrix. This arrangement could be such that the electroluminescent rods 2 are arranged in staggered rows. The invention covers other distributions of electroluminescent rods 2, notably with densities of electroluminescent rods 2 that may vary from one light source to another, and which may vary according to different areas of the same light source. FIG. 1 depicts the separation distance d1 of two immediately adjacent electroluminescent rods 2 in a first transverse direction and the separation distance d2 of two immediately adjacent electroluminescent rods 2 in a second transverse direction. The separation distances d1 and d2 are measured between two longitudinal axes 7 of adjacent electroluminescent rods 2. The number of electroluminescent rods 2 projecting from the substrate 3 may vary from one device to another, notably for increasing the light density of the semiconductor light source 1, but both separation distances d1, d2 should preferably be less than or equal to 30 micrometers, for example, less than or equal to 10 micrometers.

The semiconductor light source 1 may further comprise, a layer (not represented) of a polymer material in which electroluminescent rods 2 are at least partially embedded. The layer may thus extend over the whole extent of the substrate 3 or only around a determined group of electroluminescent rods 2. The polymer material, which may notably be silicone-based, is used to protect the electroluminescent rods 2 without hindering the diffusion of light rays. Furthermore, it is possible for this layer of polymer material to include wavelength conversion means, and, for example, luminophores, capable of absorbing at least one portion of the rays emitted by one of the electroluminescent rods 2 and converting at least one portion of the absorbed excitation light into an emission light having a different wavelength from that of the excitation light.

The semiconductor light source 1 here has a rectangular shape, but it will be understood that it may have other general shapes, and notably a parallelogram shape, without departing from the scope of the invention.

According to the invention, and as more particularly apparent in the examples of configuration given from FIG. 2, at least certain electroluminescent rods 2, referenced $2_1$ in the figures, are electrically interconnected in a first assembly dedicated to an emission of a light beam at a first wavelength, and other electroluminescent rods $2_2$ are electrically interconnected in a second assembly dedicated to an emission of a light beam at a second wavelength different from the first wavelength, the first and the second assemblies forming two selectively activable emission areas.

In the case of FIG. 2, the two assemblies are juxtaposed, in the sense that they do not overlap.

In the case of FIGS. 3 and 4, the electroluminescent rods $2_1$ of the first assembly and the electroluminescent rods $2_2$ of the second assembly are arranged so that the first assembly of electroluminescent rods $2_1$ and the second assembly of electroluminescent rods $2_2$ form two assemblies of electroluminescent rods $2_1$, $2_2$ nested together.

The assemblies of electroluminescent rods $2_1$ or $2_2$ may notably be nested together so that the respective geometric barycenters of the pattern of their electroluminescent rods 2 are close to one another, typically a distance of less than 100 micrometers.

Figure 5A:
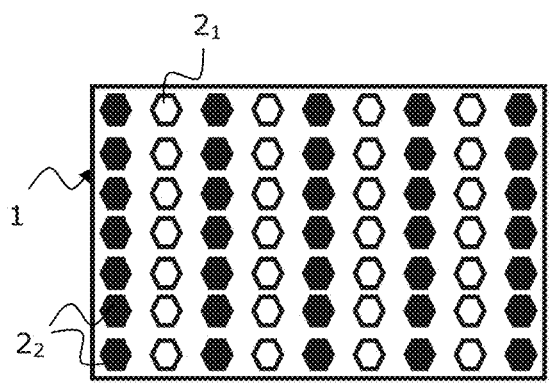
FIGS. 5a to 5d schematically illustrate other possible arrangements.
Figure 5B:
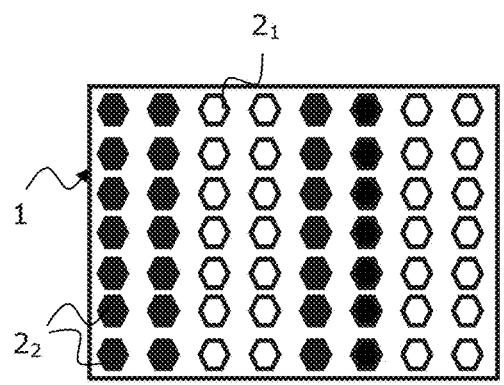

Other patterns may be adopted for the assemblies of electroluminescent rods $2_1$ or $2_2$, without departing from the scope of the present invention, as long as the semiconductor light source 1 does have an assembly dedicated to the emission of a first light beam, and an assembly dedicated to the emission of a second light beam. Thus, the graphs in FIG. 5 represent examples of other arrangements of the assemblies of electroluminescent rods $2_1$, $2_2$. FIGS. 5a and 5b represent regular arrangements, in successive strips. Each strip forms a subarea, either of the first assembly of electroluminescent rods $2_1$, or of the second assembly of electroluminescent rods $2_2$, and a subarea of the first assembly of electroluminescent rods $2_1$ is surrounded by subareas of the second assembly of electroluminescent rods $2_2$.

The first assembly of electroluminescent rods $2_1$ are all electrically connected together with electrical connection bridges. The same applies to the second assembly of electroluminescent rods $2_2$. Thus, when an assembly of electroluminescent rods $2_1$ or $2_2$ is activated, all the component electroluminescent rods $2_1$ or $2_2$, whether or not they are surrounded by electroluminescent rods $2_2$ or $2_1$, respectively, participating in the other assembly, are powered by the same electrical current. The light intensity emitted by the area corresponding to the first assembly of electroluminescent rods $2_1$ may advantageously be different from that of the area corresponding to the second assembly of electroluminescent rods $2_2$, and if the surface areas covered by the first and second areas are identical, as is the case in the illustration of FIGS. 5a and 5b, this intensity may be varied from one area to another by acting on the intensity of the power supply current, which is made possible by the fact that these two areas are electrically connected separately from each other, or by acting on the density and/or the height of the electroluminescent rods $2_1$, $2_2$ in each of the areas and subareas.

Figure 5C:
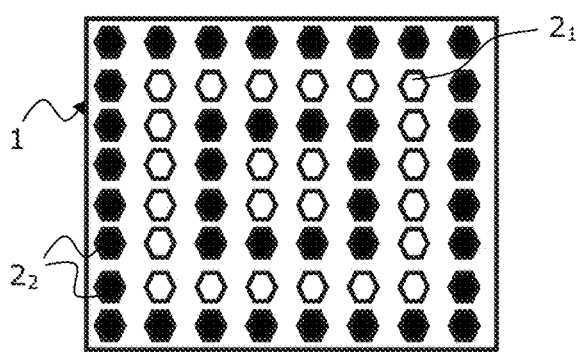

In FIG. 5c, the emitting areas corresponding to the first and second assembly of electroluminescent rods $2_1$ or $2_2$ do not have the same size and they do not have the same number of electroluminescent rods $2_1$, $2_2$ of submillimetric dimensions. Each area is composed of subareas each arranged around the others so that a subarea of the first assembly of electroluminescent rods $2_1$ is surrounded by a subarea of the second assembly of electroluminescent rods $2_1$ or $2_2$, and at least one subarea of the second assembly of electroluminescent rods $2_2$ is surrounded by a subarea of the first assembly of electroluminescent rods $2_1$. In the case illustrated, the successive strata are in the shape of squares arranged around each other, but it could be provided that the electroluminescent rods $2_1$ or $2_2$ are arranged in substantially circular subareas arranged concentrically on the center of the semiconductor light source 1. Here again, an electrical connection bridge is to be provided between each subarea of the same assembly of electroluminescent rods $2_1$ or $2_2$.

Figure 5D:
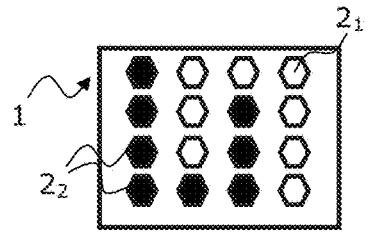

As illustrated in FIG. 5d, the intermingling of the areas of the two assemblies of electroluminescent rods $2_1$ or $2_2$ may be achieved through intrusive shapes of subareas of electroluminescent rods $2_1$ inside an expanse specific to another area of electroluminescent rods $2_2$, but with electroluminescent rods of the same area gradually connected, without it therefore being necessary to provide an electrical connection bridge between subareas separated from each other. Such an arrangement facilitates the electrical connection of the assembly.

A driving aid system for a motor vehicle in conformity with the invention combines the semiconductor light source 1 previously described with a receiving device capable of receiving light beams at the first wavelength, for example, an onboard camera at the rear of the vehicle.

The semiconductor light source 1 is advantageously accommodated in a housing closed by an outer lens of a lighting and/or signaling device of a motor vehicle. The housing defines an internal volume for receiving this semiconductor light source 1 combined with a shaping optic suitable for imaging to infinity at least one portion of the light rays emitted by the semiconductor light source 1, during simultaneous or non-simultaneous activations of the rods of the two assemblies of electroluminescent rods $2_1$ or $2_2$.

At least one of the rays emitted by the semiconductor light source 1 is deflected by the shaping optic. Deflected means that the direction of entry of the light ray into the shaping optic is different from the outgoing direction of the light ray from the shaping optic. The shaping optic includes at least one optical element such as one or more lenses, one or more reflectors, one or more light guides or a combination of these possibilities. The shaping optic may include an optic for projecting the light emitted by the semiconductor light source 1. This projection optic creates a real, and optionally anamorphosed, image of a portion of the device, for example, the semiconductor light source 1 itself or a mask, or of an intermediate image of the semiconductor light source 1, at a very great distance (finite or infinite) in view of the dimensions of the device (with a ratio of the order of at least 30, preferably 100) from the device. This projection optic may consist of one or more reflectors, or one or more lenses, or one or more light guides or a combination of these possibilities.

The particular configuration of the semiconductor light source 1 allows the use of the same optical system associated with the emission area of each of the assemblies of electroluminescent rods $2_1$ or $2_2$.

The system further comprises a control device capable of independently activating the two emission assemblies, simultaneously and/or alternately, according to the applications sought.

The selection of the second wavelength depends on the lighting and/or signaling function that is wanted. Thus, the second wavelength will be selected for emitting an amber-colored light in the case of a direction indicator, a red-colored one for a stop light, or a white-colored one for a backup light.

The first wavelength may be selected either in the visible spectrum, or in the infrared or ultra-violet. In the latter case, the two assemblies of electroluminescent rods $2_1$ or $2_2$ will be, for example, activated simultaneously.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A semiconductor light source including a plurality of three-dimensional semiconductor sources of submillimetric dimensions, wherein at least certain three-dimensional semiconductor sources are electrically interconnected in a first assembly dedicated to an emission of a light beam at a first wavelength, and other three-dimensional semiconductor sources are electrically interconnected in a second assembly dedicated to an emission of a light beam at a second wavelength different from said first wavelength, said first and the second assemblies forming two selectively activable emission areas, and wherein said first wavelength is in the infrared spectrum or the ultraviolet spectrum and said second wavelength is in the visible spectrum.

2. The semiconductor light source according to claim 1, wherein said plurality of three-dimensional semiconductor sources are separated from each other by a distance less than or equal to 30 microns.

3. The semiconductor light source according to claim 1, wherein said at least one semiconductor light source is placed in a lighting device or a signaling device of a motor vehicle, and the semiconductor light source further comprises a control device capable of configured to independently activate said two selectively activable emission areas, simultaneously or alternately.

4. The semiconductor light source according to claim 1, further comprising a third assembly of electrically interconnected three-dimensional semiconductor sources, said third assembly being dedicated to receiving a light beam at a third wavelength.

5. The semiconductor light source according to claim 4, wherein said third wavelength is selected so that said third assembly forms a reception area configured to receive light beams at said first wavelength.

6. The semiconductor light source according to claim 1, wherein said plurality of three-dimensional semiconductor sources are on the same substrate.

7. The semiconductor light source according to claim 6, wherein said three-dimensional semiconductor sources of said first assembly and said three-dimensional semiconductor sources of said second assembly are distributed so that said first assembly and said second assembly form two areas nested together.

8. A driving aid system for a motor vehicle, wherein said driving aid system comprises:
at least one semiconductor light source including a plurality of three-dimensional semiconductor sources of submillimetric dimensions, in which at least certain three-dimensional semiconductor sources are electrically interconnected in a first assembly dedicated to an emission of a light beam at a first wavelength, and other three-dimensional semiconductor sources are electrically interconnected in a second assembly dedicated to an emission of a light beam at a second wavelength different from said first wavelength, said first and the second assemblies forming two selectively activable emission areas, and
a receiving device configured to receive light beams at said first wavelength, wherein
said first wavelength is in the infrared spectrum or the ultraviolet spectrum.

9. The driving aid system according to claim 8, wherein said plurality of three-dimensional semiconductor sources are separated from each other by a distance less than or equal to 30 microns.

10. The driving aid system according to claim 8, wherein said receiving device is formed by a camera.

11. The driving aid system according to claim 8, wherein said at least one semiconductor light source further comprises a third assembly of interconnected three-dimensional semiconductor sources, said third assembly forming said receiving device.

12. The driving aid system according to claim 8, wherein the at least one semiconductor light source is placed in a lighting device or a signaling device of a motor vehicle, and said driving aid system further comprises a control device configured to independently activate said two selectively activable emission areas, simultaneously or alternately.

13. The driving aid system according to claim 12, wherein said second wavelength is selected for emitting an amber-colored light.

14. The driving aid system according to claim 12, wherein said second wavelength is selected for emitting a red-colored light.

15. The driving aid system according to claim 12, wherein said second wavelength is selected for emitting a white-colored light.

16. The driving aid system according to claim 8, wherein said plurality of three-dimensional semiconductor sources are on the same substrate.

17. The driving aid system according to claim 8, wherein the at least one semiconductor light source comprises a luminophore on at least one area facing said three-dimensional semiconductor sources of said first assembly or of said second assembly.

* * * * *